US012660237B2

(12) United States Patent
Lin et al.

(10) Patent No.:  US 12,660,237 B2
(45) Date of Patent:  Jun. 16, 2026

(54) CO-OPTIMIZATION OF FINFET DEVICES BY SOURCE/DRAIN MODULATION AND STRUCTURES THEREOF

(71) Applicant: Taiwan Semiconductor Manufacturing Company, Ltd., Hsinchu (TW)

(72) Inventors: Ta-Chun Lin, Hsinchu (TW); Jyun-Yang Shen, Kaohsiung City (TW); Chun-Jun Lin, Hsinchu City (TW); Kuo-Hua Pan, Hsinchu City (TW); Jhon Jhy Liaw, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 687 days.

(21) Appl. No.: 17/813,012

(22) Filed: Jul. 15, 2022

(65) Prior Publication Data

US 2024/0021685 A1     Jan. 18, 2024

(51) Int. Cl.
H10D 30/62          (2025.01)
H10D 30/01          (2025.01)

(52) U.S. Cl.
CPC ....... H10D 30/6219 (2025.01); H10D 30/024 (2025.01); H10D 30/6211 (2025.01)

(58) Field of Classification Search
CPC .......... H10D 30/6219; H10D 84/0193; H10D 30/6211; H10D 30/024; H10D 62/151; H10D 84/038; H10D 84/856
See application file for complete search history.

(56) References Cited

U.S. PATENT DOCUMENTS

| | | | |
|---|---|---|---|
| 8,796,666 | B1 | 8/2014 | Huang et al. |
| 8,815,712 | B2 | 8/2014 | Wan et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,962,400 | B2 | 2/2015 | Tsai et al. |

(Continued)

FOREIGN PATENT DOCUMENTS

| | | |
|---|---|---|
| TW | 201916117 A | 4/2019 |
| TW | 202135288 A | 9/2021 |
| TW | 202213743 A | 4/2022 |

*Primary Examiner* — Jay C Kim
*Assistant Examiner* — Joshua Scott Wyatt
(74) *Attorney, Agent, or Firm* — Cooper Legal Group, LLC

(57)          ABSTRACT

Structures and methods for the co-optimization of various device types include performing a first photolithography and etch process to simultaneously form a first source/drain recess for a first device in a first substrate region and a third source/drain recess for a third device in a third substrate region different than the first substrate region. In some embodiments, the method further includes performing a second photolithography and etch process to form a second source/drain recess for a second device in a second substrate region different than the first and third substrate regions. The method further includes forming a first source/drain feature within the first source/drain recess, a second source/drain feature within the second source/drain recess, and a third source/drain feature within the third source/drain recess.

20 Claims, 9 Drawing Sheets

(56)          References Cited

U.S. PATENT DOCUMENTS

| | | | |
|---|---|---|---|
| 8,963,258 | B2 | 2/2015 | Yu et al. |
| 9,093,514 | B2 | 7/2015 | Tsai et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 11,037,837 | B2 * | 6/2021 | Chen .................... H10D 84/017 |
| 2013/0285116 | A1 | 10/2013 | Lochtefeld et al. |
| 2018/0114791 | A1 | 4/2018 | Kim |

* cited by examiner

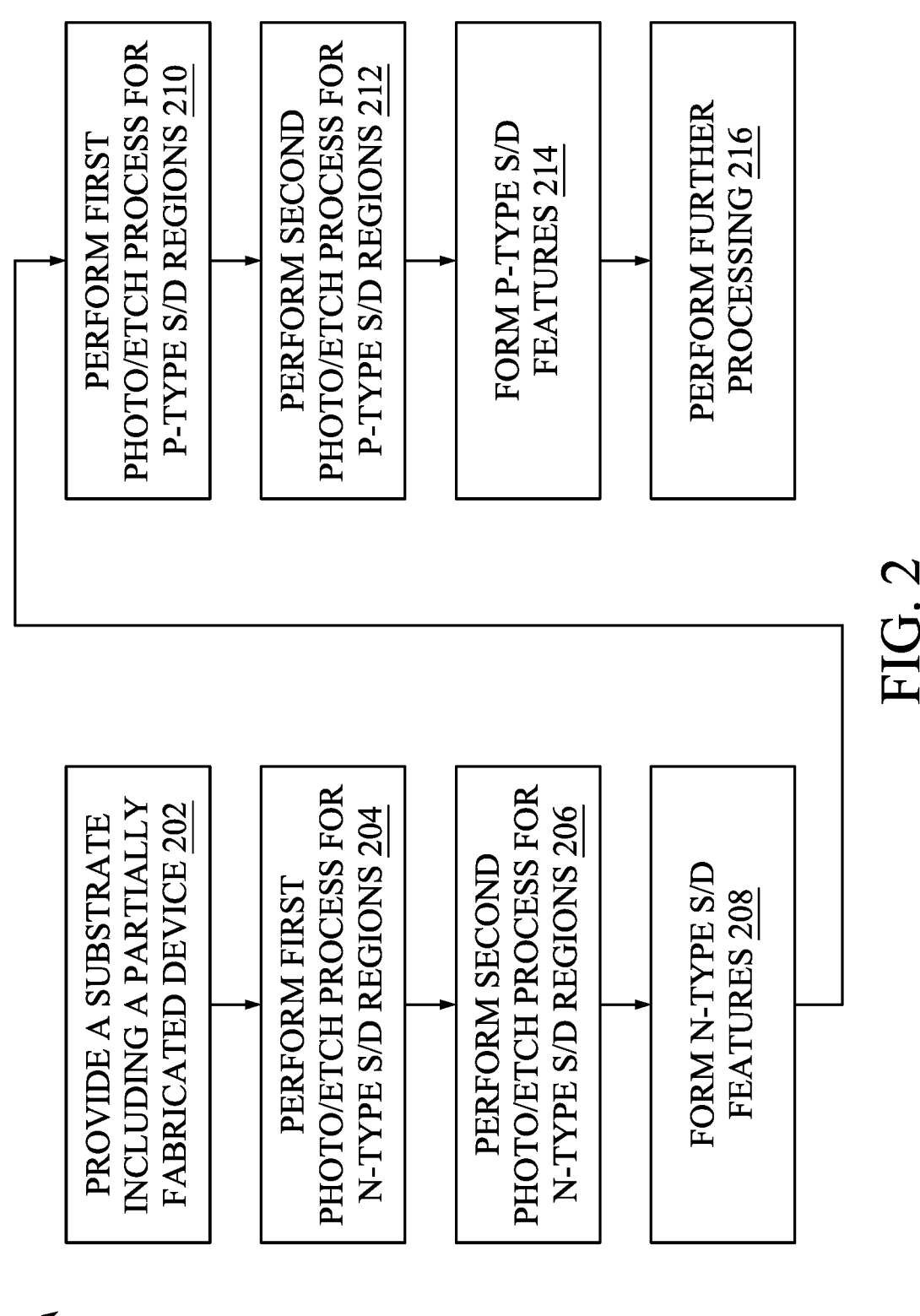

PROVIDE A SUBSTRATE INCLUDING A PARTIALLY FABRICATED DEVICE 202

PERFORM FIRST PHOTO/ETCH PROCESS FOR N-TYPE S/D REGIONS 204

PERFORM SECOND PHOTO/ETCH PROCESS FOR N-TYPE S/D REGIONS 206

FORM N-TYPE S/D FEATURES 208

PERFORM FIRST PHOTO/ETCH PROCESS FOR P-TYPE S/D REGIONS 210

PERFORM SECOND PHOTO/ETCH PROCESS FOR P-TYPE S/D REGIONS 212

FORM P-TYPE S/D FEATURES 214

PERFORM FURTHER PROCESSING 216

CO-OPTIMIZATION OF FINFET DEVICES BY SOURCE/DRAIN MODULATION AND STRUCTURES THEREOF

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). Fin-FETs have been used in a variety of applications, for example, to implement highly scaled system-on-a-chip (SOC) devices, high-performance computing (HPC) devices, and input/output (IO) devices, among others. Generally, each of these device types have different design and performance requirements. For instance, tight control of short-channel effects (SCEs) and standby-power may be particularly important for highly scaled SOC devices, while HPC devices are geared towards optimizing device speed and performance, and IO devices provide robust device reliability (e.g., protection against device breakdown). However, while being necessary to meet power, performance, area, and cost (PPAC) scaling requirements, simultaneous optimization (co-optimization) of the performance and/or design requirements of such a variety of devices has been challenging. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flow chart of a method of fabricating a semiconductor device 300 according to one or more aspects of the present disclosure.

DETAILED DESCRIPTION

Figure 1:
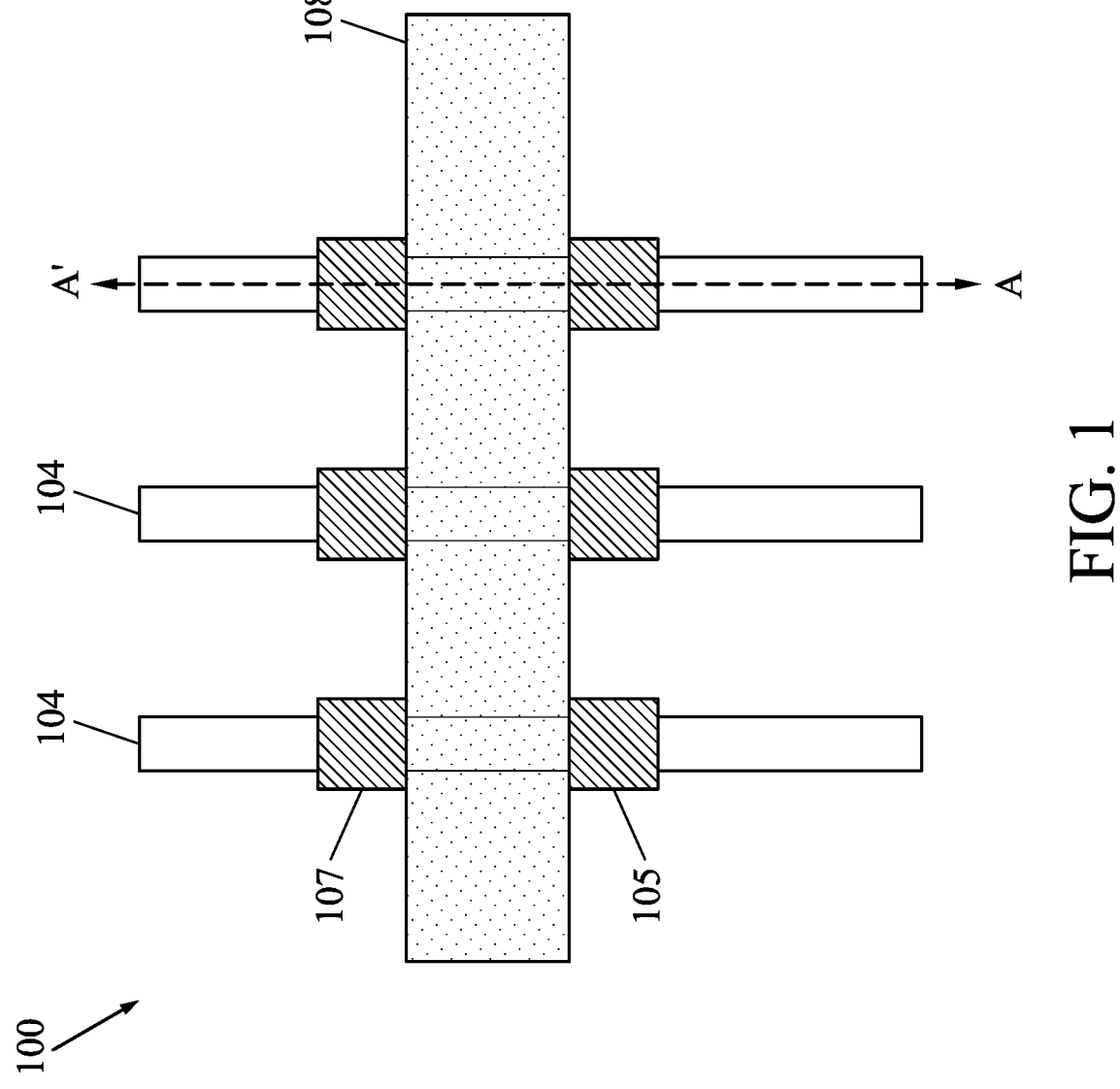
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Additionally, in some embodiments, the term "source/drain region(s)" may refer to a source or a drain, individually or collectively dependent upon the context.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

The present disclosure is generally related to semiconductor devices and methods of forming the same. In particular, embodiments of the present disclosure provide a process and/or structure for co-optimization of highly scaled system-on-a-chip (SOC) devices, high-performance computing (HPC) devices, and input/output (IO) devices to meet power, performance, area, and cost (PPAC) scaling requirements. In some examples, such co-optimization may be achieved by controlling a source/drain (S/D) proximity (e.g., a distance between a source and a drain), as described in more detail below.

FinFETs have been used in a variety of applications, for example, to implement highly scaled SOC devices, HPC devices, and IO devices, among others. Each of these device types may also have a different contacted poly pitch (CPP). For example, HPC devices may have a larger CPP than SOC devices, and IO devices may have a larger CPP than HPC devices. In addition, each of these device types have different design and performance requirements. For instance, HPC devices (with a larger CPP than SOC devices) may require an aggressive S/D proximity push (e.g., distance between the source and the drain is reduced aggressively) for ring oscillator (RO) speed and performance boost. However, SOC devices may require a more conservative S/D proximity (e.g., larger distance between the source and the drain as compared to HPC devices) for tight control of short-channel effects (SCEs) and standby-power. On the other hand, IO devices (having the largest CPP) may require the most conservative S/D proximity (e.g., largest distance between the source and the drain as compared to HPC and SOC devices) to provide robust device reliability (e.g., protection against device breakdown). However, while being necessary to meet PPAC scaling requirements, simultaneous optimization (co-optimization) of the performance and/or design requirements of such a variety of devices has been challenging. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for the co-optimization of highly scaled SOC devices, HPC devices, and IO devices. In various embodiments, a semiconductor device may include individual device structures to simultaneously meet the performance and design requirements of each of the SOC devices, HPC devices and IO devices. As an example, and in accordance with the disclosed embodiments, by using multiple photolithography (photo) and etch steps (e.g., multiple masks) for the formation of each of an N-type S/D and a P-type S/D, the S/D proximity and S/D depth can be independently optimized for each of the SOC, HPC, and IO devices. In some cases, the disclosed embodiments may be used to optimize the S/D proximity and depth of other types of devices such as static random-access memory (SRAM) devices, as well as other device types. In some cases, HPC devices are fabricated with an aggressive S/D proximity push (e.g., distance between the source and the drain is reduced aggressively) without sacrificing the performance of SOC and IO devices. In some embodiments, SOC and HPC devices may have a comparable S/D depth to provide control of SCEs and standby power.

Generally, in various embodiments, using a two-step photo/etch process (2P2E) for each of the N-type S/D and the P-type S/D, it is possible to provide an SOC device (having the smallest CPP) with a first S/D proximity, an HPC device (having a larger CPP than the SOC device) with a second S/D proximity less than the first S/D proximity, and an IO device (having the largest CPP) with a third S/D proximity greater than the first and second S/D proximity. In some cases, more than two photo/etch steps may be used for one (or both) of the N-type S/D and the P-type S/D (e.g., such as a 3P3E or 4P4E process). In at least some cases, a single photo/etch step (1P1E) may be used for one of the N-type S/D or the P-type S/D. Thus, various combinations of the number of photo/etch steps (e.g., the number of masks) may be used to fabricate the N-type and P-type S/D features across the various device types (e.g., SOC, HPC, and IO devices). For instance, based on the particular requirements for the N-type and P-type transistors across the various device types, the combinations of the number of photo/etch steps may include: (i) 2P2E or more steps used for each of an N-type S/D and a P-type S/D, (ii) 1P1E used for the N-type S/D and 2P2E or more steps used for the P-type S/D, and (iii) 2P2E or more steps used for the N-type S/D and 1P1E used for the P-type S/D. In accordance with the embodiments disclosed herein, which provide for independent control of the S/D proximity and S/D depth of each of the SOC, HPC, and IO devices, the performance and/or design requirements of various device types can be simultaneously optimized (co-optimized) to effectively meet PPAC scaling requirements. Additional embodiments and advantages are discussed below and/or will be evident to those skilled in the art in possession of this disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fins 104 extending from a substrate, a gate structure 108 disposed over and around the fins 104, and source/drain regions 105, 107, where the source/drain regions 105, 107 are formed in, on, and/or surrounding the fins 104. As used herein, a source/drain region, or "s/d region," may refer to a source or a drain of a device. It may also refer to a region that provides a source and/or drain for multiple devices. Thus, in the present example, it will be understood that the source/drain regions 105/107 may be interchangeably configured as the source region or the drain region of the multi-gate device 100. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. It is also noted that while the discussion that follows is directed to fabrication of FinFET devices, it will be understood that other types of devices (e.g., such as planar FETs, GAA FETs, or other suitable devices) may benefit from one or more of the embodiments described herein. Various other features of the multi-gate device 100 are discussed in more detail below with reference to the method of FIG. 2.

Referring to FIG. 2, illustrated therein is a method 200 of semiconductor fabrication including fabrication of a semiconductor device 300 having various device types (e.g., such as SOC, HPC, and IO devices) formed on a given substrate and that are co-optimized, for example by controlling S/D proximity and S/D depth, in accordance with various embodiments. In some embodiments, the co-optimization described with respect to the method 200 may be performed using a two-step photo/etch process (2P2E) for each of an N-type S/D and a P-type S/D for the various device types (e.g., the SOC, HPC, and IO devices). However, as noted above and discussed further below, other combinations of the number of photo/etch steps used for the N-type S/D and the P-type S/D for the various device types are possible. The method 200 is also discussed below with reference to fabrication of FinFET devices. However, it will be understood that aspects of the method 200 may be equally applied to other types of devices such as planar FETs, GAA devices, other suitable devices, or other types of devices implemented using such devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

It is noted that certain aspects of the method 200 are described as being performed in a region of the semiconductor device 300 including a particular device type (e.g., such as a P-type SOC device or an N-type SOC device, a P-type HPC device or an N-type HPC device, and a P-type IO device or an N-type IO device). However, if not described as being performed in a region including a particular device type, the step of the method 200 being described may be assumed as being performed across a plurality of regions including a plurality of device types (e.g., across a plurality of device type regions). Further, the semiconductor device 300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 may include a plurality of semiconductor devices (e.g., transistors) which may be interconnected. Moreover, it is noted that the process steps of method 200, including any descriptions given with reference to the figures are merely exemplary and are not intended to be limiting beyond what is specifically recited in the claims that follow.

The method 200 begins at block 202 where a substrate including a partially fabricated device is provided. Referring to the example of FIGS. 3A, 3B, and 3C, in an embodiment of block 202, partially fabricated N-type and P-type SOC devices 301N, 301P are provided in a region 302A of a substrate, partially fabricated N-type and P-type HPC devices 303N, 303P are provided in a region 302B of the substrate, and partially fabricated N-type and P-type IO devices 305N, 305P are provided in a region 302C of the substrate. In some embodiments, each of the N-type and P-type devices in each of the regions 302A, 302B, 302C may include a multi-gate device (e.g., such as a FinFET device), similar to the multi-gate device 100, discussed above. As such, FIGS. 3A, 3B, and 3C provide cross-sectional views of embodiments of the N-type and P-type SOC devices 301N, 301P, the N-type and P-type HPC devices 303N, 303P, and the N-type and P-type IO devices 305N, 305P along a plane substantially parallel to a plane defined by section AA' of FIG. 1 (e.g., along the direction of the fins 104).

Each of the N-type and P-type SOC devices 301N, 301P, the N-type and P-type HPC devices 303N, 303P, and the N-type and P-type IO devices 305N, 305P may be formed within different regions 302A, 302B, 302C of the same substrate, such as a silicon substrate. In some cases, the substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, the substrate may optionally include an epitaxial layer (epi-layer), may be strained for performance enhancement, may include a silicon-on-insulator (SOI) structure, and/or have other suitable enhancement features.

Figures 3A, 3B, 3C:
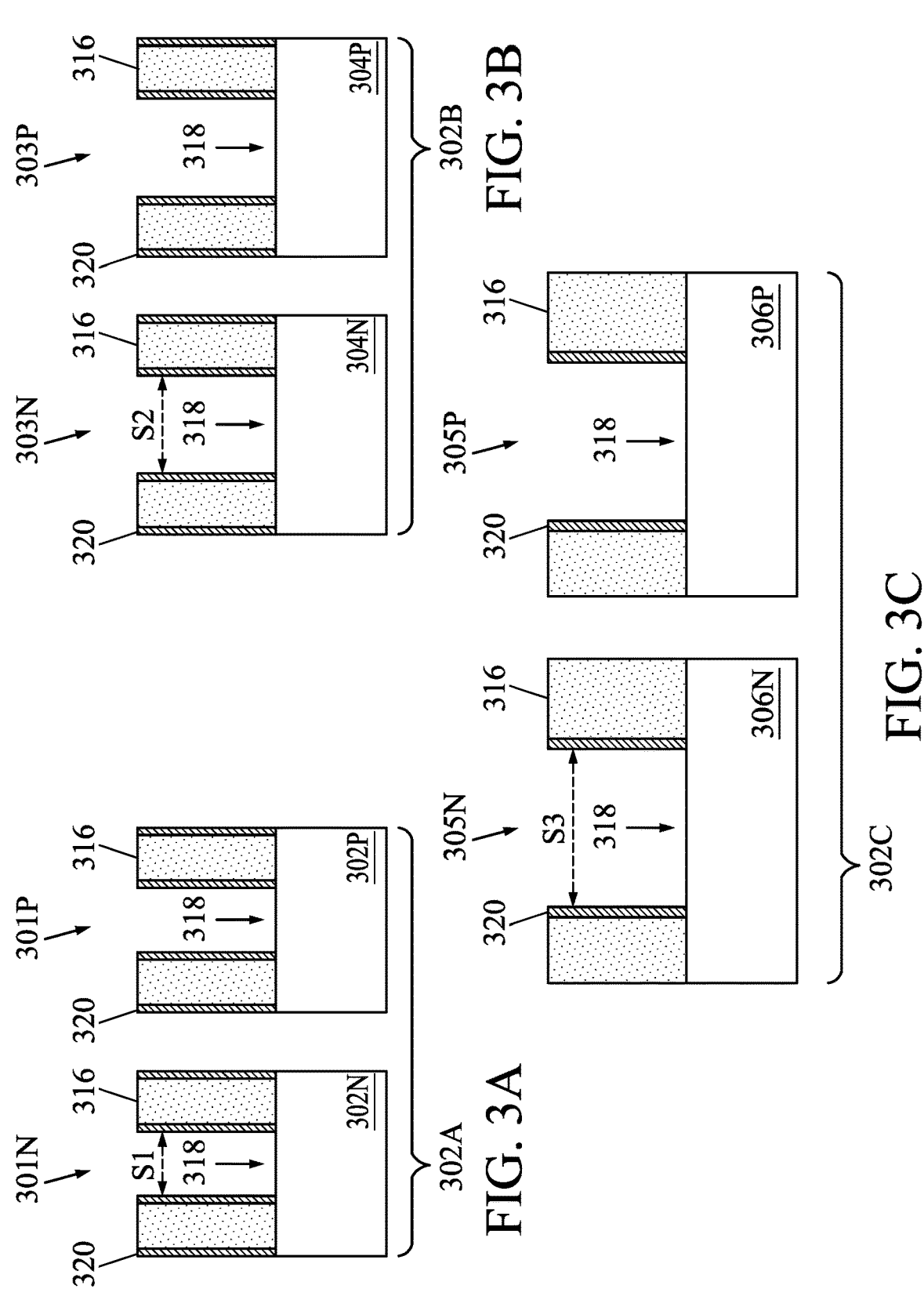
FIGS. 3A, 3B, 3C, 4A, 4B, 4C, 5A, 5B, 5C, 6A, 6B, 6C, 7A, 7B, 7C, 8A, 8B, 8C, 9A, 9B, and 9C, provide cross-sectional views of embodiments of various device types, formed in different regions of a substrate at various stages of processing according to the method of FIG. 2, along a plane substantially parallel to a plane defined by section AA' of FIG. 1, according to one or more aspects of the present disclosure.

As shown in FIGS. 3A, 3B, and 3C, the N-type and P-type SOC devices 301N, 301P include fins 302N, 302P which extend from the underlying substrate in the region 302A, the N-type and P-type HPC devices 303N, 303P include fins 304N, 304P which extend from the underlying substrate in the region 302B, and the N-type and P-type IO devices 305N, 305P include fins 306N, 306P which extend from the underlying substrate in the region 302C. The fins formed in each of the regions 302A, 302B, and 302C may be similar to the fins 104, discussed above. In addition, shallow trench isolation (STI) features may also be formed to isolate each of the fins 302N, 302P, 304N, 304P, 306N, 306P from neighboring fins.

In some embodiments, the number of fins used to form each of the N-type and P-type SOC devices 301N, 301P, the N-type and P-type HPC devices 303N, 303P, and the N-type and P-type IO devices 305N, 305P, within each of the regions 302A, 302B, 302C, may vary. In some cases, the N-type and P-type SOC devices 301N, 301P formed in the region 302A may each include a single fin, the N-type and P-type HPC devices 303N, 303P formed in the region 302B may each include two fins, and the N-type and P-type IO devices 305N, 305P formed in the region 302C may each include three fins. However, other embodiments are possible. For instance, in some examples, the N-type and P-type SOC devices 301N, 301P formed in the region 302A may each alternatively include two fins.

In various embodiments, each of the N-type and P-type SOC devices 301N, 301P, the N-type and P-type HPC devices 303N, 303P, and the N-type and P-type IO devices 305N, 305P also include gate stacks 316 formed over respective fins 302N, 302P, 304N, 304P, 306N, 306P within each of the regions 302A, 302B, 302C. In an embodiment, the gate stacks 316 are dummy (sacrificial) gate stacks that are subsequently removed and replaced by a final gate stack at a subsequent processing stage. For example, the gate stacks 316 may be replaced at a later processing stage by a high-K dielectric layer (HK) and metal gate electrode (MG). While the present discussion is directed to a replacement gate (gate-last) process whereby a dummy gate structure is formed and subsequently replaced, other configurations may be possible (e.g., such as a gate-first process). The portion of the fins 302N, 302P, 304N, 304P, 306N, 306P underlying their respective gate stacks 316 may be referred to as a channel region of the device. The gate stacks 316 may also define source/drain regions 318 of the fins 302N, 302P, 304N, 304P, 306N, 306P, for example, which includes the regions of the fins 302N, 302P, 304N, 304P, 306N, 306P adjacent to the gate stacks 316 and on opposing sides of the channel region.

In some embodiments, the gate stacks 316 include a dielectric layer and an electrode layer formed over the dielectric layer. In some embodiments, the dielectric layer of the gate stacks 316 includes silicon oxide. Alternatively, or additionally, the dielectric layer of the gate stacks 316 may include silicon nitride, a high-K dielectric material or other suitable material. In some embodiments, the electrode layer of the gate stacks 316 may include polycrystalline silicon (polysilicon). In some embodiments, one or more spacer layers 320 may be formed on sidewalls of the gate stacks 316. In some cases, the one or more spacer layers 320 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the one or more spacer layers 320 include multiple layers, such as main spacer layers, liner layers, and the like.

In various examples, and because each of the SOC devices, HPC devices, and IO devices have a different CPP, the gate stacks 316 in the different regions 302A, 302B, 302C also have different gate spacings. For example, in some embodiments, the gate stacks 316 in the region 302A (for SOC devices) may have a first gate spacing S1, the gate stacks 316 in the region 302B (for HPC devices) may have a second gate spacing S2 greater than the first gate spacing S1 (e.g., since the HPC devices have a larger CPP than SOC devices), and the gate stacks 316 in the region 302C (for IO devices) may have a third gate spacing S3 greater than the second gate spacing S2 (e.g., since the IO devices have a larger CPP than HPC devices). In some cases, a width of the gate stacks 316 in the region 302C (for IO devices) may also be greater than a width of the gate stacks 316 in either of the region 302A (for SOC devices) or the region 302B (for HPC devices).

The method 200 proceeds to block 204 where a first photo/etch process for N-type S/D regions is performed. Referring to the example of FIGS. 4A, 4B, and 4C, in an embodiment of block 204, a first photo/etch process is performed to form source/drain recesses 402, 404, respectively, within source/drain regions 318 of the N-type SOC device 301N and the N-type IO device 305N. Initially, a photoresist (resist) layer may be deposited and patterned (e.g., by exposure and development of the resist) to form a patterned resist layer which exposes the N-type SOC device 301N and the N-type IO device 305N while the P-type SOC device 301P, the N-type and P-type HPC devices 303N, 303P, and the P-type IO device 305P remain protected by the patterned resist layer. In some cases, a hard mask layer may be used in conjunction with the photoresist layer. For example, in some embodiments, a pattern formed in the resist layer may be transferred to an underlying hard mask layer (e.g., by etching), and the patterned hard mask layer may then be used to protect the P-type SOC device 301P, the N-type and P-type HPC devices 303N, 303P, and the P-type IO device 305P when the N-type SOC device 301N and the N-type IO device 305N are exposed. Whether or not a hard mask layer is used, and after exposure of the N-type SOC device 301N and the N-type IO device 305N, an etching process (e.g., wet etch, dry etch, or combination thereof) is performed to remove portions of the fins 302N, 306N in the source/drain regions 318 of the N-type SOC device 301N and the N-type IO device 305N to form the source/drain recesses 402, 404. In some embodiments, the source/drain etching process is a dry etch using an etchant that includes a chlorine-containing gas, a fluorine-containing gas or both, such as $Cl_2$, $CCl_2F_2$, $SF_6$, or a combination thereof. After formation of the source/drain recesses 402, 404, the patterned photoresist layer and/or hard mask layer are removed (e.g., such as by using an appropriate etchant, solvent, or ashing process).

Figures 4A, 4B, 4C:
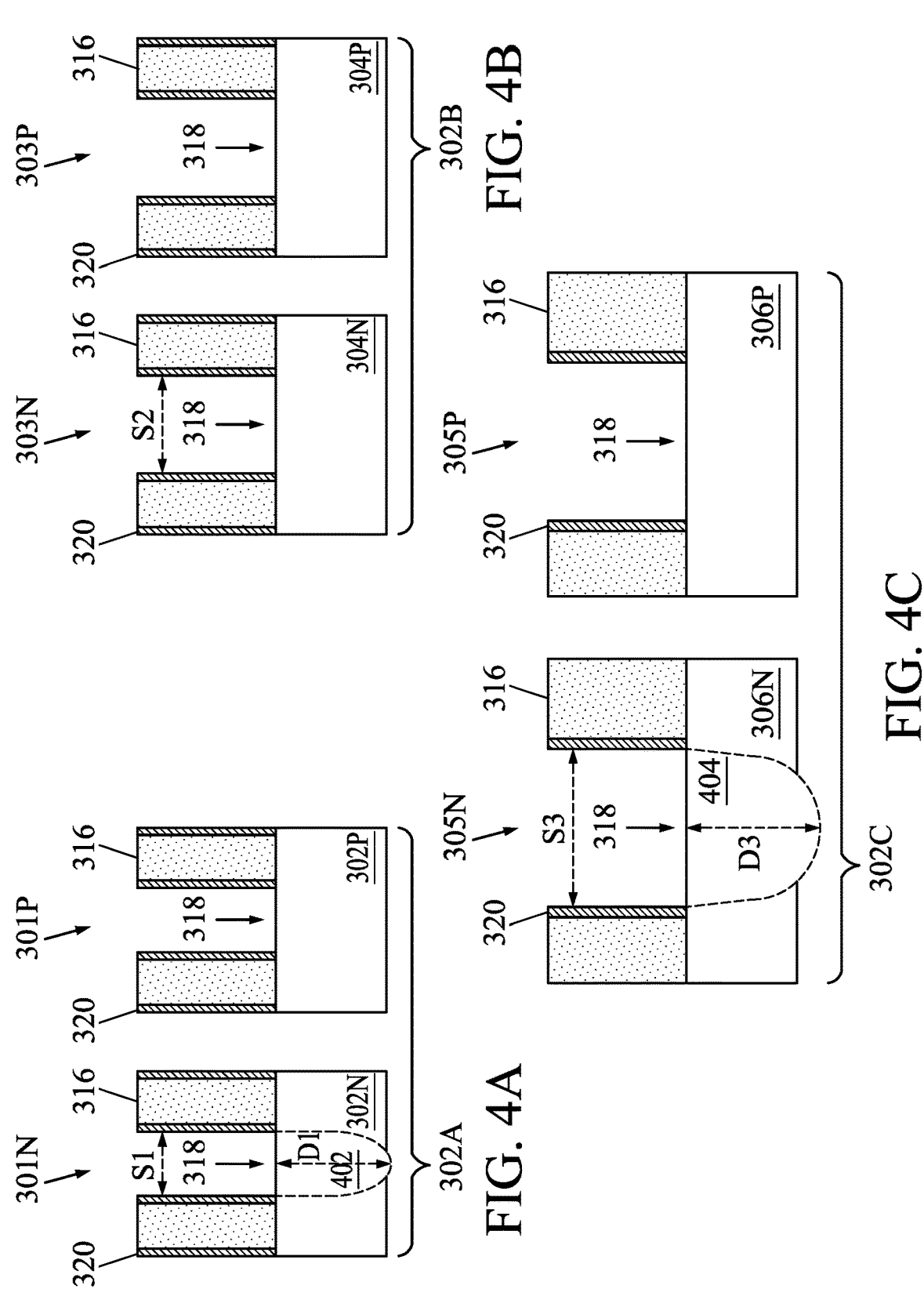

As shown in FIGS. 4A and 4C, a depth D1 of the source/drain recess 402 in the source/drain region 318 of the N-type SOC device 301N may be less than a depth D3 of the source/drain recess 404 in the source/drain region 318 of the N-type IO device 305N. In some examples, this difference may be due to an etch loading effect, where substrate regions having a larger gate spacing have a greater etch rate than substrate regions having a smaller gate spacing. In the present example, the IO devices have a greater gate spacing (S3) as compared to the gate spacing of the SOC devices (S1), thus the etch rate within the region 302C (for IO devices) will be greater than the etch rate within the region 302A (for SOC devices). It is also noted that the etching process to form the source/drain recesses 402, 404 may effectively define the S/D proximity for each of the N-type SOC device 301N and the N-type IO device 305N. As previously noted, the S/D proximity of the IO devices (e.g., such as the N-type IO device 305N) will be greater than the proximity of the SOC devices (e.g., such as the N-type SOC device 301N). Thus, the N-type IO device 305N will have a larger distance between a source and drain as compared to the N-type SOC device 301N. Stated another way, the N-type IO device 305N will have a larger spacing between a given source or drain and an adjacent gate stack 316 as compared to the N-type SOC device 301N.

The method 200 proceeds to block 206 where a second photo/etch process for N-type S/D regions is performed. Referring to the example of FIGS. 5A, 5B, and 5C, in an embodiment of block 206, a second photo/etch process is performed to form a source/drain recess 502 within a source/drain region 318 of the N-type HPC device 303N. Initially, a photoresist (resist) layer may be deposited and patterned (e.g., by exposure and development of the resist) to form a patterned resist layer which exposes the N-type HPC device 303N while the N-type and P-type SOC devices 301N, 301P, the P-type HPC device 303P, and the N-type and P-type IO devices 305N, 305P remain protected by the patterned resist layer. In some cases, a hard mask layer may be used in conjunction with the photoresist layer, as previously described. Whether or not a hard mask layer is used, and after exposure of the N-type HPC device 303N, an etching process (e.g., wet etch, dry etch, or combination thereof) is performed to remove portions of the fin 304N in the source/drain region 318 of the N-type HPC device 303N to form the source/drain recess 502. After formation of the source/drain recess 502, the patterned photoresist layer and/or hard mask layer are removed (e.g., such as by using an appropriate etchant, solvent, or ashing process).

In some embodiments, the etching process used to form the source/drain recess 502 includes a multi-step etch process, where a first etch step forms a generally U-shaped source/drain recess and a second etch step includes an isotropic or wet etch (e.g., proximity push) to extend the lateral boundaries of the source/drain recess 502. In some embodiments, the first step of the multi-step etch process includes a dry etch using an etchant that includes a chlorine-containing gas, a fluorine-containing gas or both, such as $Cl_2$, $CCl_2F_2$, $SF_6$, or a combination thereof. In some examples, the second etch step of the multi-step etch process (e.g., the isotropic or wet etch) includes a wet etchant including $O_3$, HF, TMAH, or a combination thereof. Alternatively, in some embodiments, the etching process used to form the source/drain recess 502 includes only the isotropic or wet etch, which both forms the source/drain recess 502 and extends the lateral boundaries of the source/drain recess 502. In some cases, the isotropic or wet etch may form protrusions 504 along the sides of the source/drain recess 502, where the protrusions 504 may, in some cases, extend beneath the adjacent one or more spacer layers 320 and/or the gate stack 316. In this manner, the S/D proximity of the N-type HPC device 303N can be aggressively reduced.

Figures 5A, 5B, 5C:
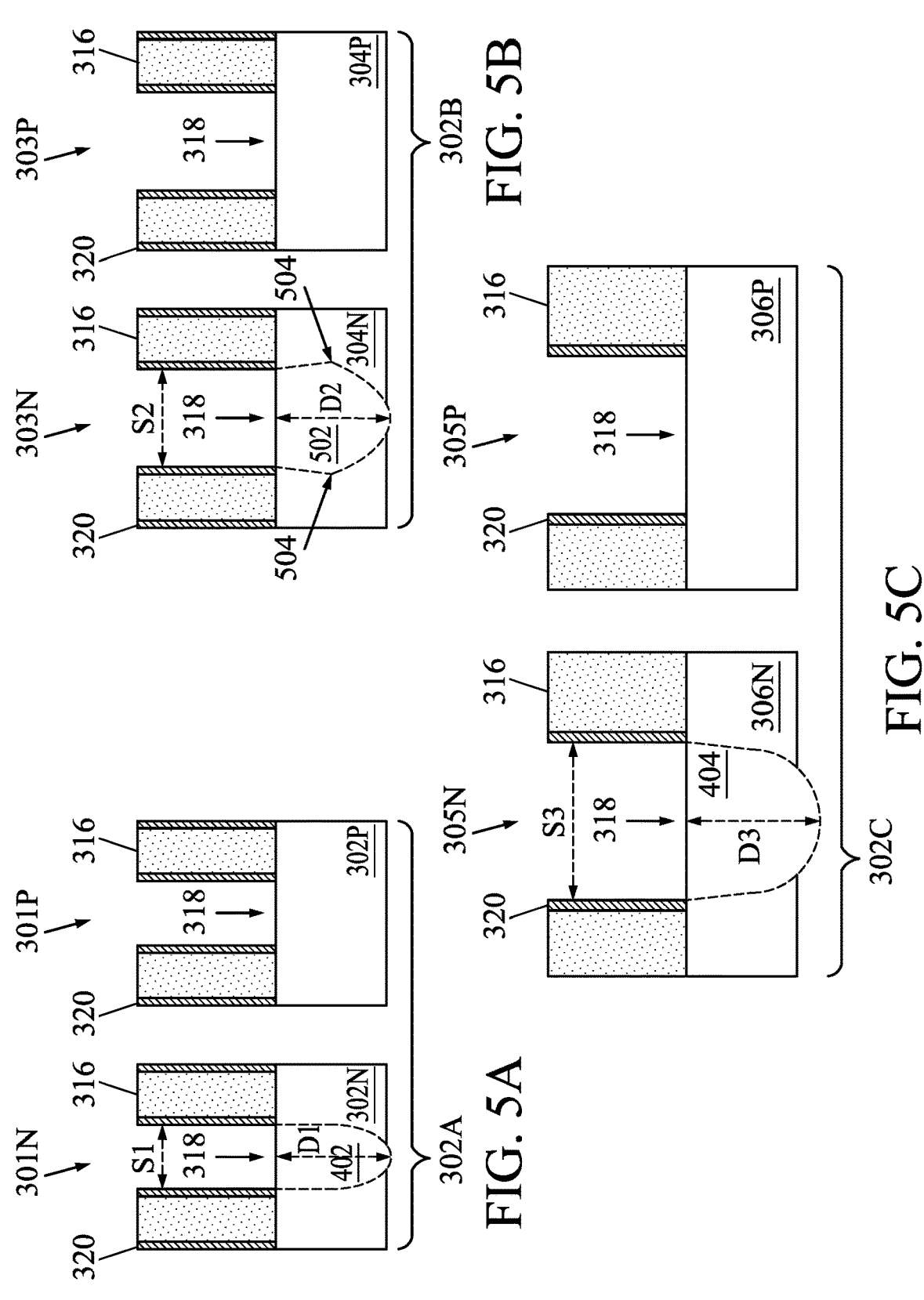

As shown in FIG. 5B, the source/drain recess 502 in the source/drain region 318 of the N-type HPC device 303N is formed to a depth D2. At least because of the second photo/etch process of block 206 is used only to form the source/drain recess 502 within a single region (e.g., the region 302B), the etch loading effect is not an issue. Moreover, because the source/drain recess 502 of the N-type HPC device 303N is formed separately from those of the N-type SOC device 301N and the N-type IO device 305N, the S/D proximity and S/D depth of the N-type HPC device 303N can be independently controlled and optimized. In some embodiments, the depth D2 of the source/drain recess 502 of the N-type HPC device 303N is comparable to, or substantially equal to, the depth D1 of the source/drain recess 402 of the N-type SOC device 301N, thereby providing enhanced control of SCEs and standby power. The etching process to form the source/drain recess 502 also effectively defines the S/D proximity for the N-type HPC device 303N. By way of example, and because of the isotropic or wet etch used to form the source/drain recess 502, the S/D proximity of the HPC devices (e.g., such as the N-type HPC device 303N) will be less than the proximity of both the SOC devices (e.g., such as the N-type SOC device 301N) and the IO devices (e.g., such as the N-type IO device 305N). Thus, the N-type HPC device 303N will have a smaller distance between a source and drain as compared to both the N-type SOC device 301N and the N-type IO device 305N. Stated another way, the N-type HPC device 303N will have a smaller spacing, and in some cases an underlap, between a given source or drain and an adjacent gate stack 316 in comparison to the N-type SOC device 301N and the N-type IO device 305N.

Figures 6A, 6B, 6C:
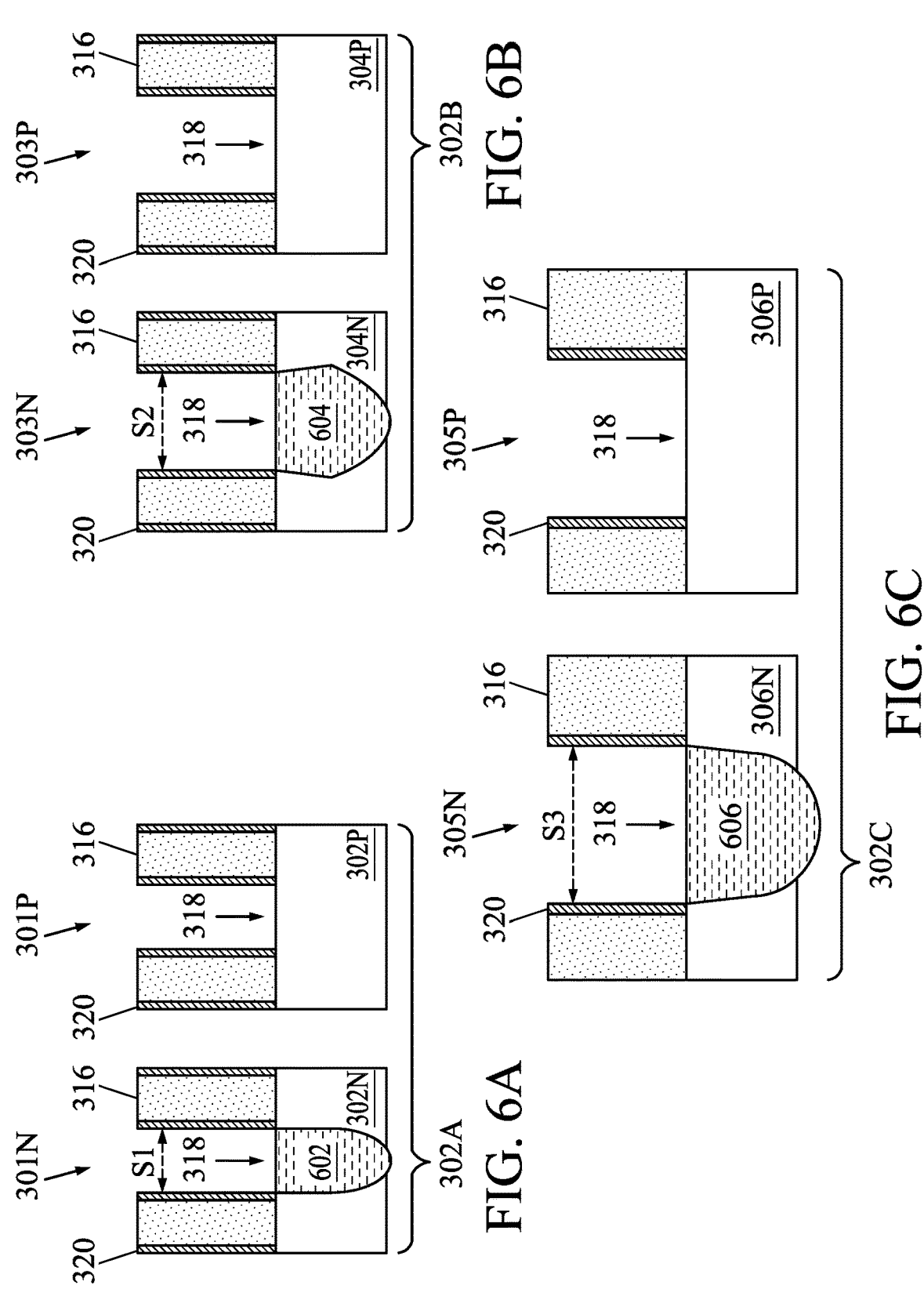

The method 200 then proceeds to block 208 where N-type source/drain features are formed. Referring to FIGS. 6A, 6B, and 6C, in an embodiment of block 208, N-type source/drain features 602 are formed in the source/drain recess 402 of the N-type SOC device 301N, N-type source/drain features 604 are formed in the source/drain recess 502 of the N-type HPC device 303N, and N-type source/drain features 606 are formed in the source/drain recess 404 of the N-type IO device 305N. In some embodiments, the source/drain features 602, 604, 606 are formed in the source/drain regions 318 adjacent to and on either side of the gate stacks 316 of each of the N-type SOC device 301N, the N-type HPC device 303N, and the N-type IO device 305N. In some embodiments, a clean process may be performed immediately prior to formation of the source/drain features 602, 604, 606. The clean process may include a wet etch, a dry etch, or a combination thereof.

In some embodiments, the source/drain features 602, 604, 606 are formed by epitaxially growing a semiconductor material layer in the source/drain regions 318. In various embodiments, the semiconductor material layer grown to form the source/drain features 602, 604, 606 may include Ge, Si, GaAs, AlGaAs, SiGe, GaAsP, SiP, or other suitable material. The source/drain features 602, 604, 606 may be formed by one or more epitaxial (epi) processes. In some embodiments, the source/drain features 602, 604, 606 may be in-situ doped during the epi process. For example, in some embodiments, the source/drain features 602, 604, 606 are doped with an N-type dopant species such as phosphorous, arsenic, antimony, or other suitable dopant species such as carbon. In some examples, the source/drain features 602, 604, 606 may include SiC or Si doped with phosphorous. In some embodiments, the source/drain features 602, 604, 606 are not in-situ doped, and instead an implantation process is performed to dope the source/drain features 602, 604, 606. In various examples, and after formation of the source/drain features 602, 604, 606, an annealing process may be performed (e.g., such as a rapid thermal anneal, laser anneal, or other suitable annealing process). It is noted that in some embodiments, the source/drain features 602, 604, 606 may be epitaxially grown such that they extend above a top surface of their respective fins 302N, 304N, 306N, being referred to as raised source/drain features. In accordance with the embodiments disclosed herein, the N-type source/drain features 602, 604, 606 are thus effectively co-optimized for the N-type SOC, HPC, and IO devices.

The method 200 proceeds to block 210 where a first photo/etch process for P-type S/D regions is performed. Referring to the example of FIGS. 7A, 7B, and 7C, in an embodiment of block 210, a first photo/etch process is performed to form source/drain recesses 702, 704, respectively, within source/drain regions 318 of the P-type SOC device 301P and the P-type IO device 305P. Initially, a photoresist (resist) layer may be deposited and patterned (e.g., by exposure and development of the resist) to form a patterned resist layer which exposes the P-type SOC device 301P and the P-type IO device 305P while the N-type SOC device 301N, the N-type and P-type HPC devices 303N, 303P, and the N-type IO device 305N remain protected by the patterned resist layer. In some cases, a hard mask layer may be used in conjunction with the photoresist layer, as previously discussed. Whether or not a hard mask layer is used, and after exposure of the P-type SOC device 301P and the P-type IO device 305P, an etching process (e.g., wet etch, dry etch, or combination thereof) is performed to remove portions of the fins 302P, 306P in the source/drain regions 318 of the P-type SOC device 301P and the P-type IO device 305P to form the source/drain recesses 702, 704. In some embodiments, the source/drain etching process is a dry etch using an etchant that includes a chlorine-containing gas, a fluorine-containing gas or both, such as $Cl_2$, $CCl_2F_2$, $SF_6$, or a combination thereof. After formation of the source/drain recesses 702, 704, the patterned photoresist layer and/or hard mask layer are removed (e.g., such as by using an appropriate etchant, solvent, or ashing process).

Figures 7A, 7B, 7C:
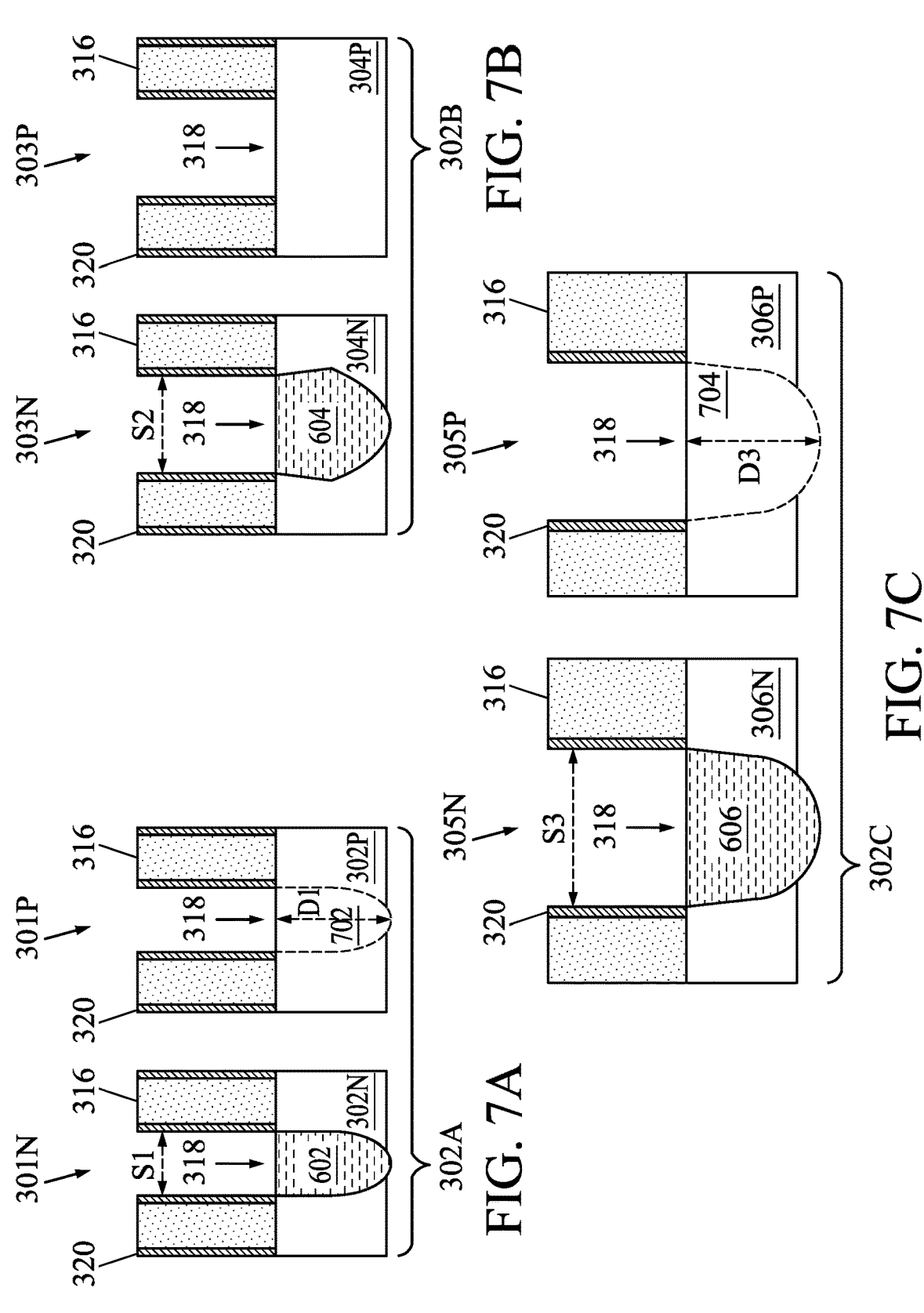

As shown in FIGS. 7A and 7C, the source/drain recess 702 in the source/drain region 318 of the P-type SOC device 301P has the depth D1, discussed above, and the source/drain recess 704 in the source/drain region 318 of the P-type IO device 305P has the depth D3, discussed above, where the depth D1 is less than the depth D3. In some examples, this difference may be due to an etch loading effect, as previously discussed. It is also noted that the etching process to form the source/drain recesses 702, 704 may effectively define the S/D proximity for each of the P-type SOC device 301P and the P-type IO device 305P. As previously noted, the S/D proximity of the IO devices (e.g., such as the P-type IO device 305P) will be greater than the proximity of the SOC devices (e.g., such as the P-type SOC device 301P). Thus, the P-type IO device 305P will have a larger distance between a source and drain as compared to the P-type SOC device 301P. Stated another way, the P-type IO device 305P will have a larger spacing between a given source or drain and an adjacent gate stack 316 as compared to the P-type SOC device 301P.

The method 200 proceeds to block 212 where a second photo/etch process for P-type S/D regions is performed. Referring to the example of FIGS. 8A, 8B, and 8C, in an embodiment of block 212, a second photo/etch process is performed to form a source/drain recess 802 within a source/drain region 318 of the P-type HPC device 303P. Initially, a photoresist (resist) layer may be deposited and patterned (e.g., by exposure and development of the resist) to form a patterned resist layer which exposes the P-type HPC device 303P while the N-type and P-type SOC devices 301N, 301P, the N-type HPC device 303N, and the N-type and P-type IO devices 305N, 305P remain protected by the patterned resist layer. In some cases, a hard mask layer may be used in conjunction with the photoresist layer, as previously described. Whether or not a hard mask layer is used, and after exposure of the P-type HPC device 303P, an etching process (e.g., wet etch, dry etch, or combination thereof) is performed to remove portions of the fin 304P in the source/drain region 318 of the P-type HPC device 303P to form the source/drain recess 802. After formation of the source/drain recess 802, the patterned photoresist layer and/or hard mask layer are removed (e.g., such as by using an appropriate etchant, solvent, or ashing process).

In some embodiments, the etching process used to form the source/drain recess 802 includes a multi-step etch process, where a first etch step forms a generally U-shaped source/drain recess and a second etch step includes an isotropic or wet etch (e.g., proximity push) to extend the lateral boundaries of the source/drain recess 802. In some embodiments, the first step of the multi-step etch process includes a dry etch using an etchant that includes a chlorine-containing gas, a fluorine-containing gas or both, such as $Cl_2$, $CCl_2F_2$, $SF_6$, or a combination thereof. In some examples, the second etch step of the multi-step etch process (e.g., the isotropic or wet etch) includes a wet etchant including $O_3$, HF, TMAH, or a combination thereof. Alternatively, in some embodiments, the etching process used to form the source/drain recess 802 includes only the isotropic or wet etch, which both forms the source/drain recess 802 and extends the lateral boundaries of the source/drain recess 802. In some cases, the isotropic or wet etch may form protrusions 804 along the sides of the source/drain recess 802, where the protrusions 804 may, in some cases, extend beneath the adjacent one or more spacer layers 320 and/or the gate stack 316. In this manner, the S/D proximity of the P-type HPC device 303P can be aggressively reduced.

Figures 8A, 8B, 8C:
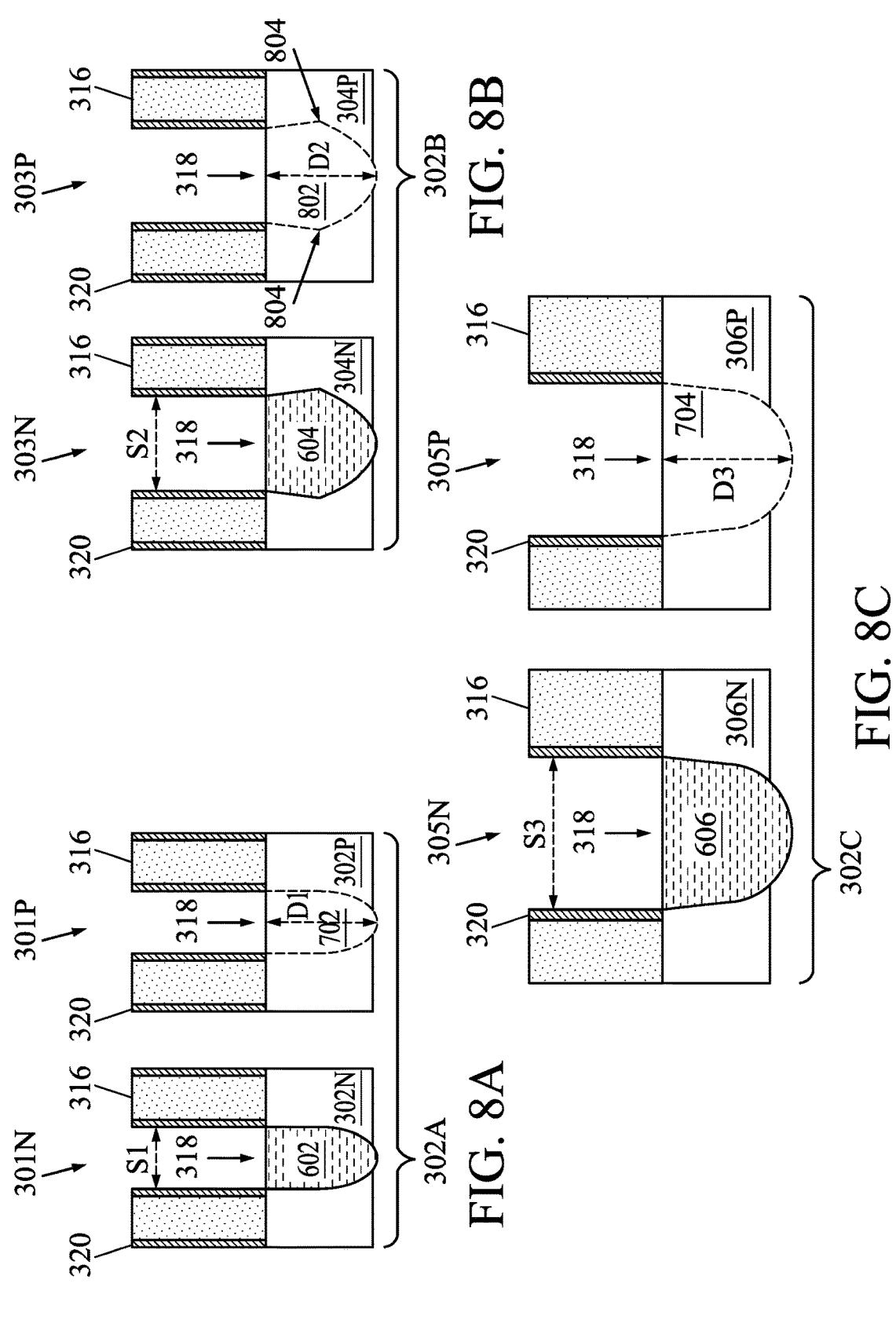

As shown in FIG. 8B, the source/drain recess 802 in the source/drain region 318 of the P-type HPC device 303P is formed to the depth D2, discussed above. At least because of the second photo/etch process of block 212 is used only to form the source/drain recess 802 within a single region (e.g., the region 302B), the etch loading effect is not an issue. Moreover, because the source/drain recess 802 of the P-type HPC device 303P is formed separately from those of the P-type SOC device 301P and the P-type IO device 305P, the S/D proximity and S/D depth of the P-type HPC device 303P can be independently controlled and optimized. In some embodiments, the depth D2 of the source/drain recess 802 of the P-type HPC device 303P is comparable to, or substantially equal to, the depth D1 of the source/drain recess 702 of the P-type SOC device 301P, thereby providing enhanced control of SCEs and standby power. The etching process to form the source/drain recess 802 also effectively defines the S/D proximity for the P-type HPC device 303P. By way of example, and because of the isotropic or wet etch used to form the source/drain recess 802, the S/D proximity of the HPC devices (e.g., such as the P-type HPC device 303P) will be less than the proximity of both the SOC devices (e.g., such as the P-type SOC device 301P) and the IO devices (e.g., such as the N-type IO device 305P). Thus, the P-type HPC device 303P will have a smaller distance between a source and drain as compared to both the P-type SOC device 301P and the P-type IO device 305P. Stated another way, the P-type HPC device 303P will have a smaller spacing, and in some cases an underlap, between a given source or drain and an adjacent gate stack 316 in comparison to the P-type SOC device 301P and the P-type IO device 305P.

Figures 9A, 9B, 9C:
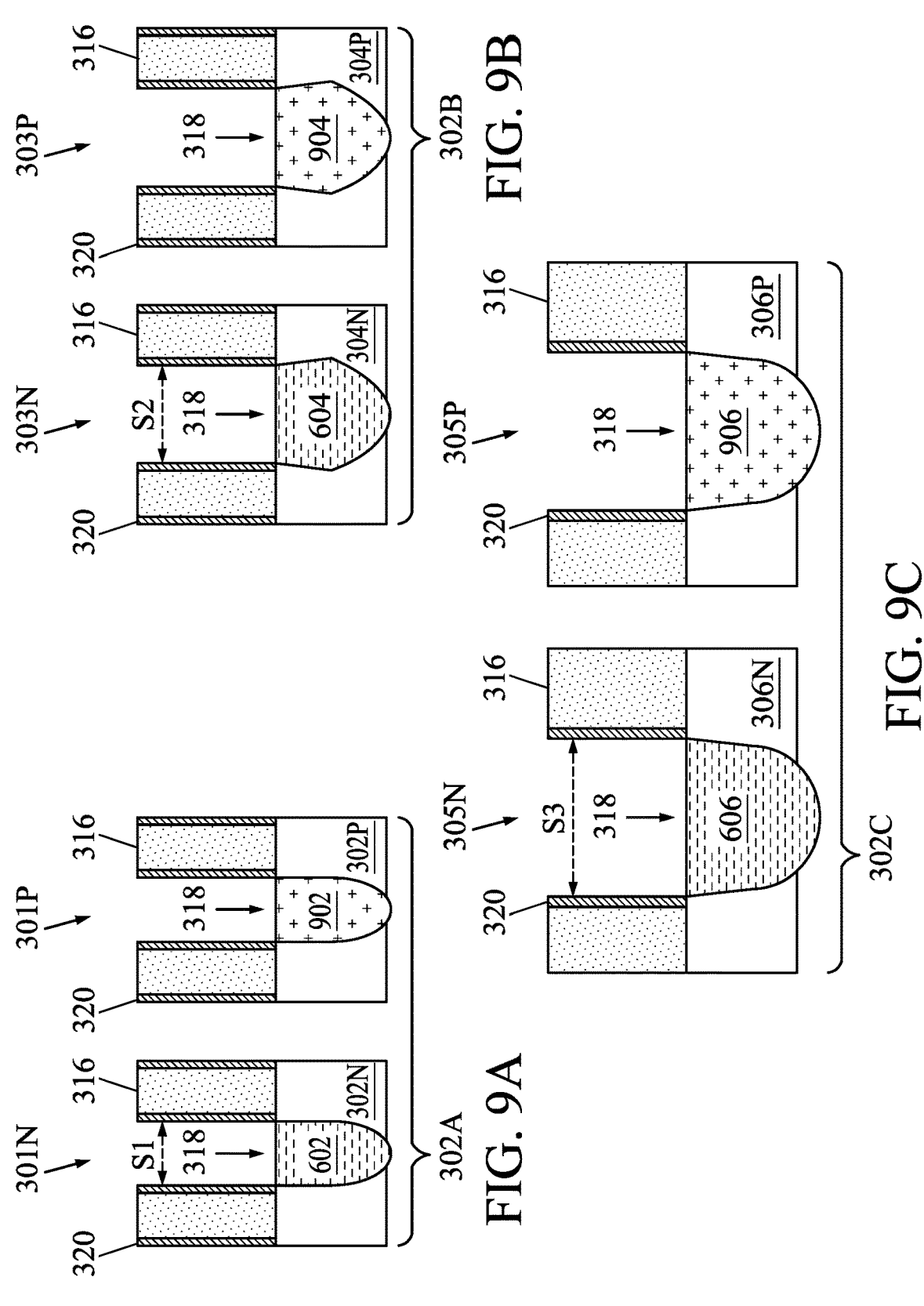

The method 200 then proceeds to block 214 where P-type source/drain features are formed. Referring to FIGS. 9A, 9B, and 9C, in an embodiment of block 214, P-type source/drain features 902 are formed in the source/drain recess 702 of the P-type SOC device 301P, P-type source/drain features 904 are formed in the source/drain recess 802 of the P-type HPC device 303P, and P-type source/drain features 906 are formed in the source/drain recess 704 of the P-type IO device 305P. In some embodiments, the source/drain features 902, 904, 906 are formed in the source/drain regions 318 adjacent to and on either side of the gate stacks 316 of each of the P-type SOC device 301P, the P-type HPC device 303P, and the P-type IO device 305P. In some embodiments, a clean process may be performed immediately prior to formation of the source/drain features 902, 904, 906. The clean process may include a wet etch, a dry etch, or a combination thereof.

In some embodiments, the source/drain features 902, 904, 906 are formed by epitaxially growing a semiconductor material layer in the source/drain regions 318. In various embodiments, the semiconductor material layer grown to form the source/drain features 902, 904, 906 may include Ge, Si, GaAs, AlGaAs, SiGe, GaAsP, SiP, or other suitable material. The source/drain features 902, 904, 906 may be formed by one or more epitaxial (epi) processes. In some embodiments, the source/drain features 902, 904, 906 may be in-situ doped during the epi process. For example, in some embodiments, the source/drain features 902, 904, 906 are doped with a P-type dopant species such as boron, $BF_2$, or other suitable dopant species such as carbon. In some examples, the source/drain features 902, 904, 906 may include SiGe or Si doped with boron. In some embodiments, the source/drain features 902, 904, 906 are not in-situ doped, and instead an implantation process is performed to dope the source/drain features 902, 904, 906. In various examples, and after formation of the source/drain features 902, 904, 906, an annealing process may be performed (e.g., such as a rapid thermal anneal, laser anneal, or other suitable annealing process). It is noted that in some embodiments, the source/drain features 902, 904, 906 may be epitaxially grown such that they extend above a top surface of their respective fins 302P, 304P, 306P, being referred to as raised source/drain features. In accordance with the embodiments disclosed herein, the P-type source/drain features 902, 904, 906 are thus effectively co-optimized for the P-type SOC, HPC, and IO devices.

The method 200 then proceeds to block 216 where further processing is performed. For example, after formation of the P-type source/drain features (block 214), a contact etch stop layer (CESL) and an inter-layer dielectric (ILD) layer are formed over the device 300 and a chemical mechanical polishing (CMP) process is performed. In some embodiments, the CMP process may expose a top surface of the gate stacks 316 (e.g., by removing portions of the ILD layer and CESL) overlying the gate stacks 316 and planarize a top surface of the device 300. In addition, the CMP process may remove any hard mask layers overlying the gate stacks 316, if any, to expose the underlying electrode layer of the gate stacks 316, such as a polysilicon electrode layer. In a further embodiment of block 216, the exposed electrode layer of the gate stacks 316 may initially be removed by suitable etching processes, followed by an etching process to remove the dielectric layer of the gate stacks 316 within each of the regions 302A, 302B, 302C. In some examples, the etching processes may include a wet etch, a dry etch, or a combination thereof.

After removal of the dummy gates (e.g., the gate stacks 316), and in a further embodiment of block 216, a gate structure is formed over the N-type and P-type devices within each of the regions 302A, 302B, 302C. The gate structure may include a high-K/metal gate stack, however other compositions are possible. In some embodiments, the gate structure may form the gate associated with each of the N-type and P-type SOC devices 301N, 301P, the N-type and P-type HPC devices 303N, 303P, and the N-type and P-type IO devices 305N, 305P. In some embodiments, the gate structure includes an interfacial layer (IL) (e.g., such as silicon oxide ($SiO_2$), HfSiO, or silicon oxynitride) and a high-K dielectric layer formed over the IL. In some embodiments, the high-K dielectric layer may include hafnium oxide ($HfO_2$). Alternatively, the high-K dielectric layer may include $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In various embodiments, the IL and the high-K dielectric layer collectively define a gate dielectric of the gate structure.

In a further embodiment of block 216, a metal gate including a metal layer is formed over the gate dielectric (e.g., over the IL and the high-K dielectric layer). The metal layer may include a metal, metal alloy, or metal silicide. In various examples, the metal layer may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. Additionally, the formation of the gate dielectric/metal gate stack may include depositions to form various gate materials, one or more liner layers, and one or more CMP processes to remove excessive gate materials and thereby planarize a top surface of the device 300.

Generally, the semiconductor device 300 may undergo further processing to form various features and regions known in the art. For example, further processing may form various contacts/vias/lines and multilayer interconnect features (e.g., metal layers and interlayer dielectrics) on the substrate, configured to connect the various features to form a functional circuit that may include one or more multi-gate devices (e.g., FinFET devices). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be modified, replaced, or eliminated in accordance with various embodiments of the method 200.

For example, while the method 200 has been described as first forming the N-type source/drain regions and then the P-type source/drain regions, it will be understood that is some cases the P-type source/drain regions may be formed before the N-type source/drain regions. Further, while the method 200 was described as performed using a two-step photo/etch process (2P2E) for each of an N-type S/D and a P-type S/D for the various device types (e.g., the SOC, HPC, and IO devices), other embodiments are possible. For instance, instead of performing first and second photo/etch processes for N-type source/drain regions (blocks 204, 206 of the method 200) and first and second photo/etch processes for P-type source/drain regions (blocks 210, 212 of the method 200), some embodiments may include performing first and second photo/etch processes for only one of the N-type source/drain regions or the P-type source/drain regions, and performing a single photo/etch process for the other of the N-type source/drain regions or the P-type source/drain regions.

As an example, a single photo/etch process (1P1E) can be used to simultaneously form source/drain recesses in source/drain regions of each of the various N-type devices (e.g., the N-type SOC, HPC, and IO devices) within which N-type source/drain features are subsequently formed, while a two-step photo/etch process (2P2E) is used for the P-type S/D for the various device types (e.g., the P-type SOC, HPC, and IO devices) as described above with reference to blocks 210, 212 of the method 200. Alternatively, a single photo/etch process (1P1E) can be used to simultaneously form source/drain recesses in source/drain regions of each of the various P-type devices (e.g., the P-type SOC, HPC, and IO devices) within which P-type source/drain features are subsequently formed, while a two-step photo/etch process (2P2E) is used for the N-type S/D for the various device types (e.g., the N-type SOC, HPC, and IO devices) as described above with reference to blocks 204, 206 of the method 200.

In a further example, the N-type S/D and/or the P-type S/D for the various device types (e.g., the SOC, HPC, and IO devices) may be formed using a three-step photo/etch process (3P3E). In such an example, source/drain recesses are formed in N-type and/or P-type source/drain regions of exactly one device type at a time of the various device types (e.g., the SOC, HPC, and IO devices) within which N-type and/or P-type source/drain features are subsequently formed. Thus, three-steps are needed to form the source/drain recesses within the N-type and/or P-type source/drain regions of all three device types (e.g., the SOC, HPC, and IO devices).

In some embodiments, the S/D proximity and depth of an SRAM device may be optimized along with those of the SOC, HPC, and IO devices. In such an example, it is possible that the N-type S/D and/or the P-type S/D for the various device types (e.g., the SOC, HPC, IO, and SRAM devices) may be formed using a four-step photo/etch process (4P4E). In such an example, source/drain recesses are formed in N-type and/or P-type source/drain regions of exactly one device type at a time of the various device types (e.g., the SOC, HPC, IO, SRAM devices) within which N-type and/or P-type source/drain features are subsequently formed. Thus, four-steps are needed to form the source/drain recesses within the N-type and/or P-type source/drain regions of all four device types (e.g., the SOC, HPC, IO, SRAM devices).

Still other combinations of the number of photo/etch steps may include: 2P2E steps for the N-type S/D and 3P3E or 4P4E used for the P-type S/D, 2P2E steps for the P-type S/D and 3P3E or 4P4E used for the N-type S/D, 1P1E step for the N-type S/D and 2P2E, 3P3E or 4P4E used for the P-type S/D, and 1P1E step for the P-type S/D and 2P2E, 3P3E or 4P4E used for the N-type S/D. While various exemplary modifications to the method 200 have been discussed, it will be understood that the above examples are merely illustrative and not meant to be limiting. Those of skill in the art, having the benefit of the present disclosure, will understand that yet other embodiments and/or modifications are possible, without departing from the scope of this disclosure.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include structures and methods for the co-optimization of highly scaled SOC devices, HPC devices, and IO devices. In various embodiments, a semiconductor device may include individual device structures to simultaneously meet the performance and design requirements of each of the SOC devices, HPC devices and IO devices. As an example, and in accordance with the disclosed embodiments, by using multiple photo/etch steps (e.g., multiple masks) for the formation of each of an N-type S/D and a P-type S/D, the S/D proximity and S/D depth can be independently optimized for each of the SOC, HPC, and IO devices. In some cases, the disclosed embodiments may be used to optimize the S/D proximity and depth of other types of devices such SRAM devices, as well as other device types. Generally, in accordance with the embodiments disclosed herein, the S/D proximity and S/D depth can be independently controlled and optimized (co-optimized) for each of a variety device types (e.g., such as SOC, HPC, IO, and SRAM devices) to effectively meet PPAC scaling requirements. Additional embodiments and advantages will be evident to those skilled in the art in possession of this disclosure.

Thus, one of the embodiments of the present disclosure described a method that includes performing a first photolithography and etch process to simultaneously form a first source/drain recess for a first device in a first substrate region and a third source/drain recess for a third device in a third substrate region different than the first substrate region. In some embodiments, the method further includes performing a second photolithography and etch process to form a second source/drain recess for a second device in a second substrate region different than the first and third substrate regions. The method further includes forming a first source/drain feature within the first source/drain recess, a second source/drain feature within the second source/drain recess, and a third source/drain feature within the third source/drain recess.

In another of the embodiments, discussed is a method that includes providing a substrate including a plurality of regions, where each region of the plurality of regions includes a different device type. In some embodiments, the method further includes forming source/drain recesses within source/drain regions of each of the different device types in each region of the plurality of regions, where the source/drain recess for at least one device type in a first region of the plurality of regions is formed separately from the source/drain recess for other device types in other regions of the plurality of regions different than the first region. The method further includes epitaxially growing a source/drain feature in the source/drain recesses formed within the source/drain regions of each of the different device types in each region of the plurality of regions.

In yet another of the embodiments, discussed is a semiconductor device having a first device type disposed within a first substrate region, where the first device type includes a first source/drain feature. In some embodiments, the semiconductor device further includes a second device type disposed within a second substrate region, where the second device type includes a second source/drain feature. In some examples, the semiconductor device further includes a third device type disposed within a third substrate region, where the third device type includes a third source/drain feature. In some cases, the first device type has a first source/drain proximity, the second device type has a second source/drain proximity less than the first source/drain proximity, and the third device type has a third source/drain proximity greater than the first source/drain proximity and the second source/drain proximity. In some embodiments, the first source/drain feature has a first depth, the second source/drain feature has a second depth, and the third source/drain feature has a third depth, where the first depth is substantially equal to the second depth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

performing a first photolithography and etch process to simultaneously form a first source/drain recess for a first device of a first doping type in a first substrate region and a third source/drain recess for a third device of the first doping type in a third substrate region different than the first substrate region;

performing a second photolithography and etch process to form a second source/drain recess for a second device of the first doping type in a second substrate region different than the first substrate region and the third substrate region, wherein:

the second source/drain recess extends into a first fin along a third direction, the second source/drain recess is positioned between a first gate stack and a second gate stack arranged on the first fin along a first direction different than the third direction, the first gate stack and the second gate stack extend lengthwise along a second direction different than the first direction and the third direction, and a first gate spacer is adjacent the first gate stack along the first direction; and forming a first source/drain feature of the first doping type within the first source/drain recess, a second source/drain feature of the first doping type within the second source/drain recess, and a third source/drain feature of the first doping type within the third source/drain recess, the second source/drain feature having a protrusion underlying the first gate spacer such that a line extending in the third direction passing through the first gate spacer passes through the protrusion.

2. The method of claim 1, wherein:

the first photolithography and etch process defines the first source/drain recess for a first N-type source/drain region of the first device, the first photolithography and etch process defines the third source/drain recess for a third N-type source/drain region of the third device, and the second photolithography and etch process defines the second source/drain recess for a second N-type source/drain region of the second device.

3. The method of claim 1, wherein:

the first photolithography and etch process defines the first source/drain recess for a first P-type source/drain region of the first device, the first photolithography and etch process defines the third source/drain recess for a third P-type source/drain region of the third device, and the second photolithography and etch process defines the second source/drain recess for a second P-type source/drain region of the second device.

4. The method of claim 1, wherein:

the first device comprises a system-on-a-chip (SOC) device, the second device comprises a high-performance computing (HPC) device, and the third device comprises an input/output (IO) device.

5. The method of claim 1, wherein:

the first device has a first contacted poly pitch (CPP), the second device has a second CPP greater than the first CPP, and the third device has a third CPP greater than the second CPP.

6. The method of claim 1, wherein:

the first device has a first source/drain proximity, the second device has a second source/drain proximity less than the first source/drain proximity, and the third device has a third source/drain proximity greater than the first source/drain proximity and the second source/drain proximity.

7. The method of claim 1, wherein the second photolithography and etch process further comprises a multi-step etch process.

8. The method of claim 7, wherein the multi-step etch process comprises a first etch step that forms a U-shaped source/drain recess and a second etch step that comprises an isotropic or wet etch that extends lateral boundaries of the U-shaped source/drain recess to form protrusions along sides of the second source/drain recess.

9. The method of claim 1, wherein the second photolithography and etch process comprises an isotropic or wet etch to form the second source/drain recess and to extend lateral boundaries of the second source/drain recess to form protrusions along sides of the second source/drain recess.

10. The method of claim 1, wherein:

the first source/drain recess has a first depth, the second source/drain recess has a second depth, the third source/drain recess has a third depth, and the first depth is substantially equal to the second depth.

11. A method, comprising:

providing a substrate comprising a plurality of regions, wherein each region of the plurality of regions comprises a different device type of the same doping type;

forming source/drain recesses within source/drain regions of each of the different device types in each region of the plurality of regions, wherein:

a first source/drain recess of the source/drain recesses for at least one device type in a first region of the plurality of regions is formed in a separate process from the source/drain recess for other device types in other regions of the plurality of regions different than the first region, the first source/drain recess is formed in a first fin in the first region, the first source/drain recess is between a first gate stack and a second gate stack arranged adjacent each other along a first direction, extending lengthwise along a second direction different than the first direction, and having height along a third direction different than the first direction and the second direction, and the first source/drain recess underlies the first gate stack and the second gate stack such that a line extending in the third direction passes through the first source/drain recess and the first gate stack; and epitaxially growing a source/drain feature in the source/drain recesses formed within the source/drain regions of each of the different device types in each region of the plurality of regions.

12. The method of claim 11, wherein the forming source/drain recesses comprises:

performing a first photolithography and etch process to form the source/drain recess for the at least one device type in the first region of the plurality of regions; and performing a second photolithography and etch process to simultaneously form the source/drain recess for the other device types in the other regions of the plurality of regions different than the first region.

13. The method of claim 11, wherein the source/drain regions of each of the different device types in each region of the plurality of regions comprise N-type source/drain regions or P-type source/drain regions.

14. The method of claim 11, wherein the different device types in each region of the plurality of regions comprise a system-on-a-chip (SOC) device, a high-performance computing (HPC) device, and an input/output (IO) device.

15. The method of claim 11, wherein the at least one device type in the first region has a smaller source/drain proximity than the other device types in the other regions.

16. The method of claim 11, wherein formation of the source/drain recess for the at least one device type comprises an isotropic or wet etch that forms protrusions along sides of the source/drain recess for the at least one device type.

17. The method of claim 11, wherein:

the source/drain recess for the at least one device type in the first region has a first depth, the source/drain recess for another device type in another region of the plurality of regions has a second depth, and the first depth is substantially equal to the second depth.

18. A method of fabricating a semiconductor device, comprising:

providing a semiconductor device comprising a first gate stack and a second gate stack arranged on a first fin and adjacent each other along a first direction in a second substrate region, at least one of the first gate stack or the second gate stack having length extending in a second direction different than the first direction and height extending in a third direction different than the first direction and the second direction;

performing a first photolithography and etch process to form a first source/drain recess for a first device of a first dopant type in a first substrate region and a third source/drain recess for a third device of the first dopant type in a third substrate region different than the first substrate region;

while the first source/drain recess and the second source/drain recess are protected by a mask, performing a second photolithography and etch process to form a second source/drain recess for a second device of the first dopant type between the first gate stack and the second gate stack in the second substrate region different than the first substrate region and the third substrate region and exposed through the mask, wherein the second photolithography and etch process removes material of the first fin along the third direction and the first direction such that a protrusion is defined along a side of the second source/drain recess, the protrusion underlying a gate spacer adjacent the first gate stack along the first direction; and forming a first source/drain feature within the first source/drain recess, a second source/drain feature within the second source/drain recess, and a third source/drain feature within the third source/drain recess.

19. The method of claim 18, wherein the performing a second photolithography and etch process comprises performing the second photolithography and etch process such that the second source/drain recess underlies the first gate stack and a line extending in the third direction passes through the first gate stack and the second source/drain recess.

20. The method of claim 18, wherein:

the performing a first photolithography and etch process comprises performing a first dry etch, and the performing a second photolithography and etch process comprises performing a second dry etch and performing a wet etch after the second dry etch.

* * * * *